ated May 26, 1981

United States Patent [19]
Gibbons

[11] 4,270,018
[45] May 26, 1981

[54] AMORPHOUS SOLAR CELLS

[76] Inventor: James F. Gibbons, 320 Tennyson Ave., Palo Alto, Calif. 94301

[21] Appl. No.: 107,437

[22] Filed: Dec. 26, 1979

[51] Int. Cl.³ .......................................... H01L 31/04
[52] U.S. Cl. ...................................... 136/258; 357/2; 357/30
[58] Field of Search ................ 136/89 TF; 357/2, 30

[56] References Cited
U.S. PATENT DOCUMENTS 4,024,558   5/1977   Merrin .................................. 357/2

OTHER PUBLICATIONS

W. Fuhs et al., "Heterojunctions of Amorphous Silicon & Silicon Single Crystals", Int. Conf. Tetrahedrally Bonded Semiconductors, Yorktown Heights, N.Y. (1974), pp. 345–350.

N. Tohge et al., "The Electrical & Photoro Haic Properties of Heterojunctions Between an Amorphous Ge–Te–Se Film & Crystalline Silicon", *Thin Solid Films,* vol. 56, pp. 377–382, (1979).

G. K. Bhagavat et al., "Semiconducting Amorphous Carbon Films & Carbon–Single Crystal Silicon Heterojunctions", *Thin Solid Films,* vol. 64, pp. 57–62, (1979).

*Primary Examiner*—Aaron Weisstuch
*Attorney, Agent, or Firm*—Flehr, Hohbach, Test, Albritton & Herbert

[57] ABSTRACT

A solar cell having single crystal or polycrystalline n-type and p-type layers separated by an amorphous layer.

3 Claims, 12 Drawing Figures

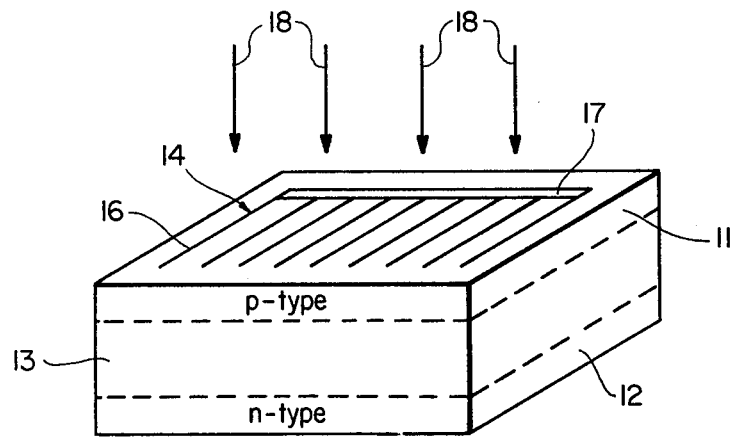
FIG__1
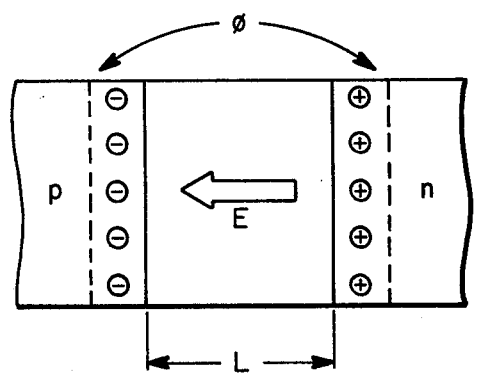
FIG__2

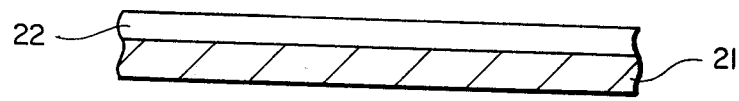
*FIG_3A*
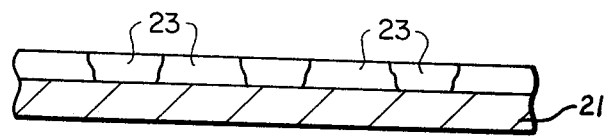
*FIG_3B*
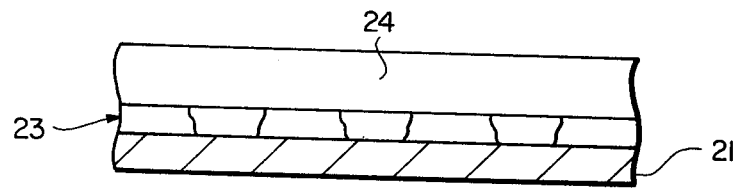
*FIG_3C*
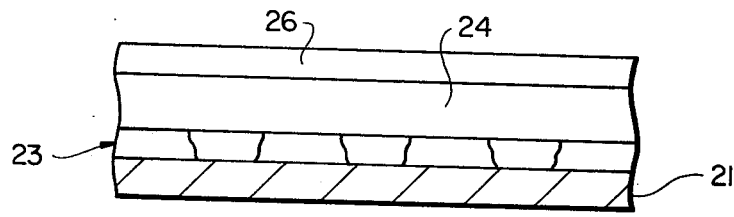
*FIG_3D*
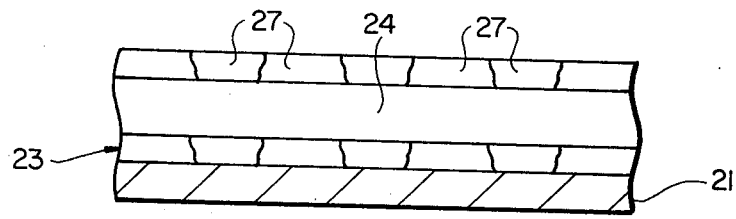
*FIG_3E*

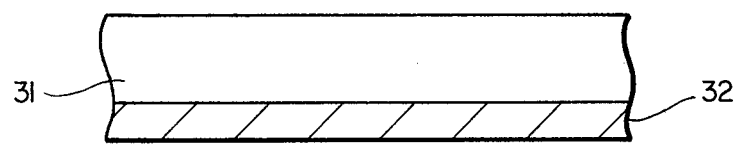
FIG__4A
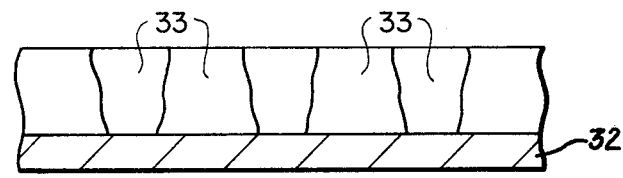
FIG__4B
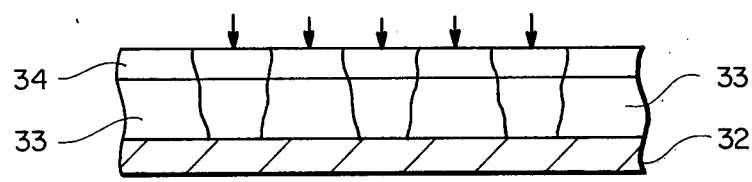
FIG__4C
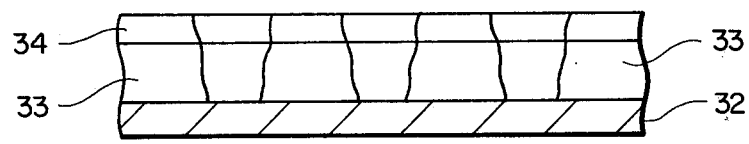
FIG__4D
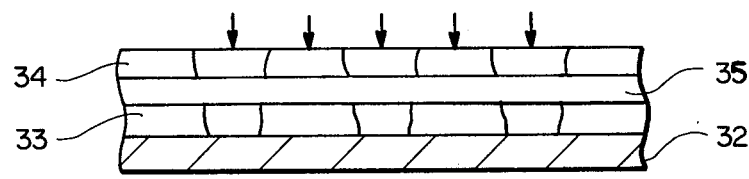
FIG__4E

AMORPHOUS SOLAR CELLS

This invention relates generally to solar cells made of semiconductor material and are more particularly to such cells including amorphous semiconductor material.

Amorphous (non-crystal) silicon is a material of great potential interest for solar cell applications. This interest arises from the fact that amorphous silicon is a highly efficient absorber of light and is at the same time extremely easy and cheap to prepare. The optical absorption characteristics are such that 0.5 μm thick layer of amophous silicon will absorb as much solar energy as a 250 μm thick layer of crystalline silicon. Hence, the use of amorphous silicon as an optical absorber leads to the use of 500 times less material than that required for a single crystal cell.

Amorphous silicon is also impressively inexpensive. It can be obtained by RF plasma deposition from a silane-based ($SiH_4$) gaseous source or by either sputtering or evaporation of silicon from either silicon powder or a charge of polycrystalline material. The RF deposition process is of special interest because it is simple to add dopants during the deposition process. Thus, p-type, n-type and intrinsic layers can be grown during one deposition run by appropriate control of the gases admitted to the plasma deposition chamber.

However, amorphous silicon cells made by any of the techniques described above are typically of very low efficiency. The reason for this is that the carrier lifetime in the amorphous layer is very short and, hence, the collection of electrons and holes from such a layer is difficult.

It is an object of the present invention to provide a solar cell including amorphous semiconductor material and a method of making the solar cell.

It is a further object of the present invention to provide a highly efficient, inexpensive solar cell and method of making the solar cell.

These and other objects are achieved by a solar cell which includes n-type and p-type polycrystalline or single crystal layers separated by an amorphous layer of semiconductor material and to a method of making the solar cell.

FIG. 1 is a perspective view of a solar cell in accordance with the present invention.

FIG. 2 is a partial sectional view showing the accelerating voltage across the amorphous layer disposed between the single crystal of polycrystalline doped layers.

FIGS. 3A–3E show the steps for one method of forming a solar cell in accordance with the present invention.

FIGS. 4A–4E show the steps for an alternate method of forming a solar cell in accordance with the present invention.

Referring to FIG. 1, the solar cell comprises a first layer 11 spaced from a second layer 12 by a layer 13 of amorphous material. Layers 11 and 12 may, for example, be single crystal or polycrystalline semiconductor material. One of the layers is p-type and the other n-type. The amorphous layer may be an intrinsic layer. Suitable contacts 14 may be formed on the upper surface. The contacts may be in the form of a comb which with relatively narrow and long teeth 16 and a wide back 17 whereby to provide for maximum penetration of solar energy into the cell, as shown by the rays 18. The layer 12 includes the second contact whereby the voltage generated between the p-type and n-type layers by carriers formed by the impinging solar energy can be recovered.

The amorphous layer serves as the optically active region in which the carriers are generated. The absorption properties of the amorphous layer are such that it will absorb substantially all of the carrier producing solar energy that strkes the cell. Referring to FIG. 2, the contact potential that normally develops across a p-n or a p-i-n junction is shown between the doped layers 11 and 12. For the purpose of this example, one assumes that the holes that leave the p-type region to form the space charge layer in the p-type material recombine with the electrons in the amorphous layer, namely the electrons coming from the n-type region. Thus, the amorpohous layer is sandwiched between p-type and n-type semiconductive layers that are either a single crystal or sufficiently large grain polycrystalline material to permit the development of space charge in the normal manner for a p-i-n junction. The two space charge layers shown in FIG. 2 produce an electric field in the intrinsic amorphous layer whose value is $E = \phi/L$.

As an example, for $\phi = 0.7$ volts and $L = 0.5$ μm, one obtains $E = 14,000$ volts/cm, a rather large field. With this field, carriers that are generated in the amorphous layer can drift to the crystalline contact layers in a time $$\tau = L^2/\mu\phi$$

where μ is the carrier mobility. Taking the value of μ of 10cm²/Vsec as representative of typical carrier mobilities in an amorphous silicon film one finds the transit time across the amorphous layer to be $$\tau \simeq 0.7 \text{ns}$$

Hence, a substantial fraction of the photogenerated carriers can be collected so long as the carrier lifetime is 1 ns or more. Without this electric field, however, the transit time would be governed by the carrier diffusion process. For the mobility assumed, the carrier diffusion length for 1 ns lifetime would be $$l_D \simeq 0.12 \text{ μm}$$

Carriers generated in most of the amorphous layers cannot be collected into the contact regions without the presence of the electric field. Hence, the electric field offers a technique for most of the carriers generated in the amorphous region to be collected even when the carrier lifetime is so short that diffusion transport cannot possibly provide an efficient means for transporting carriers to the collecting layers.

It is also possible to use an amorphous layer of one material, germanium, and a collecting layer of another material, silicon. In addition, dopant can be added to the amorphous layer while it is being grown to produce a graded impurity profile in the amorphous layer. This procedure provides an extended drift field in the amorphous layer according to U.S. Pat. No. 4,001,864 which aids the transport of carriers along the amorphous layers in the manner therein described.

FIG. 3 illustrates the steps in one process for forming a solar cell in accordance with the present invention. Starting with a graphite or other suitable substrate 21, an amorphous layer 22 is grown on the substrate by plasma deposition, FIG. 3A. The amorphous silicon may be doped with arsenic to form n-type material. Thereafter, a continuous wave laser or electron beam can be scanned over the layer 22 to recrystallize the layer into large polycrystalline silicon illustrated schematically by the crystals 23, FIG. 3B. For example, the laser beam may be generated by a Spectra Physics Model 171 argon ion laser with power output of 11 watts focused onto a 40 micrometer spot scanned over the amorphous silicon layer at a speed of 10 centimeters per second. Next, the recrystallized n-type layer is used as a base on which an amorphous layer 24 of intrinsic silicon can be grown. The amorphous layer may be 0.50 $\mu$m thick. The layer may also be formed by plasma deposition as schematically illustrated in FIG. 3C. Plasma deposition is continued with boron doped silicon to deposit a final 0.25 $\mu$m layer 26, FIG. 3D. Thereafter, a continuous wave laser operating at a power level of approximately 5 watts with other conditions as described above melts only the top 0.25 $\mu$m layer of the deposited amorphous film. This recrystallizes the layer 26 that contains the n-type dopan to form crystals 27, FIG. 3E. In this way, n-type and p-type layers are formed with high quality large grain polycrystalline material with a layer of intrinsic amorphous silicon separating the polycrystalline layers. Ohmic contacts can be made, for example, by forming comblike contacts on the upper surface by masking and evaporation or sputtering and by forming a lower contact layer by evaporation or sputtering.

An alternative method for fabricating a solar cell according to the present invention is described with reference to FIG. 4. Here a thin layer 31 of arsenic-doped amorphous silicon is deposited on a steel or graphite substance 32, FIG. 4A. The material is then recrystallized by scanning with a laser beam as described above to produce large grain n-type crystallites 33, FIG. 4B. The recrystallization may also be carried out with an electron beam or other suitable means which produces crystals which extend between the two surfaces.

Next, a heavily doped p-type layer (p++) 34 is made directly in the n-type material by implanting boron, FIG. 4C, and using a CW laser or electron beam to anneal the implantation damage under conditions that produce substantially no diffusion of the implanted boron, FIG. 4D. By an appropriate choice of implantation conditions, the (p++-n) junction can be formed at approximately 0.1$\mu$m beneath the surface.

Next, fluorine or other light ions are implanted at a dose and energy that will produce a buried amorphous layer 35, FIG. 4E. For example, implantation of flourine at a dose of $5 \times 10^{14}$/CM at an energy of 100 keV followed by a second flourine implantation at a dose of $5 \times 10^{14}$/CM$^2$ at an energy of 200 keV will succeed in amorphizing the polycrystalline silicon. The amorphous layer will start at approximately 0.1$\mu$m and continue to a depth of approximately 0.4$\mu$m. In this way we obtain p+ and n+ polycrystalline layers separated by an amorphous region as required in the present invention. Furthermore, by implanting flourine we introduce a species which tends to attach to silicon to reduce dangling bonds in the implantation-amorphized layer, thus improving the carrier lifetime in the amorphous layer.

As a third alternative, it would be possible to start with n-doped metallurgical single grade crystal or polycrystalline silicone substrate (wafers) obtained by casting, film growth (EFG) or conventional Czochralski techniques. The steps outlined in FIG. 4C–4E can then be performed to produce the p++-n junction and the buried amorphous layer.

Thus, it is seen that there has been provided a solar cell which includes a center region which is highly absorbent to the solar energy to thereby generate carriers which are quickly removed by the voltage between the n-type and p-type layers. Preferably the amorphous layer includes a gradient whereby to further enhance the collection of the generated carriers.

What is claimed is:

1. A solar cell comprising a n-type and p-type silicon single crystal or polycrystalline collecting layers separated by an amorphous layer that serves as a layer which absorbs the optical energy and generates carriers.

2. A solar cell as in claim 1 in which the amorphous layer is of different semiconductor material from said collecting layers.

3. A solar cell as in claims 1 or 2 in which the amorphous layer is provided with a doping gradient to provide an extended drift field within the amorphous layer to further assist carrier transport to the single crystal or crystalline collecting layers.

* * * * *